United States Patent
Boyd et al.

(10) Patent No.: US 6,438,162 B1
(45) Date of Patent: Aug. 20, 2002

(54) IMPLEMENTATION METHOD FOR ADAPTIVE EQUALIZER IN CMOS

(75) Inventors: Graeme B. Boyd, North Vancouver; Robert Sobot, Burnaby; David Heath Culley, Surrey, all of (CA)

(73) Assignee: PMC-Sierra Ltd., Burnaby (CA)

( * ) Notice: Subject to any disclaimer, the term of this patent is extended or adjusted under 35 U.S.C. 154(b) by 0 days.

(21) Appl. No.: 09/198,552

(22) Filed: Nov. 23, 1998

(51) Int. Cl.[7] .............................. H03H 7/30; H03H 7/40; H03K 5/159
(52) U.S. Cl. ........................ 375/232; 375/229; 375/230
(58) Field of Search ................................ 375/232, 229, 375/230, 231, 233, 236

(56) References Cited

U.S. PATENT DOCUMENTS

| | | | | |
|---|---|---|---|---|
| 4,459,698 A | * | 7/1984 | Yumoto et al. | 375/236 |
| 4,472,733 A | * | 9/1984 | Bolger | 348/618 |
| 4,580,275 A | * | 4/1986 | Pirani et al. | 375/236 |
| 4,707,840 A | * | 11/1987 | Nakayama | 375/232 |

* cited by examiner

Primary Examiner—Mohammad H. Ghayour
(74) Attorney, Agent, or Firm—Harold C. Baker; Robert A. Wilkes; Robert G. Hendry

(57) ABSTRACT

An apparatus and method for restoring digital pulses within a data transmission system which have degraded due to the attenuation and distortion inherent in a data transmission medium. The apparatus comprises an adaptive equalizer which receives signals from the data transmission medium, while the method by which the digital pulses are restored comprises: storing plural equalizer transfer function control values in a memory, passing the signal through an equalizer having a controllable transfer function, comparing a characteristic of the output signal of the equalizer with a reference signal and producing a difference signal, using the difference signal to select a set of stored transfer function control values from the memory, controlling the equalizer from the selected transfer function control values so as to minimize their difference from the reference signal. This apparatus and method are suitable for high-speed applications such as T1 and E1, requiring minimal configuration by the user.

10 Claims, 1 Drawing Sheet

IMPLEMENTATION METHOD FOR ADAPTIVE EQUALIZER IN CMOS

FIELD OF THE INVENTION

This invention relates to the field of digital transmission, and in particular to an adaptive equalizer.

BACKGROUND TO THE INVENTION

It is well known that digital pulses transmitted through telephone lines become attenuated and very distorted. Both the attenuation and the distortion are nonlinear functions of both length of the telephone line and the transmission frequency. Equalizers are used to restore the pulses to their original amplitude and shape, but introduce some jitter.

General approaches to solve the attenuation and distortion problems utilize a peak detector of one type or another to measure the amplitude of the incoming signal and compare it with some reference. Reconstitution can be effected since the amplitude and shape of the original signal at the transmitter is known. The comparing circuit generates a feedback error signal which is proportional to the loss incurred in the telephone line. The error signal is used to adjust the transfer function of the equalizer until the recovered signal generates no error signal. An edge detector (eye opening monitor) can be used to help a decision circuit create a more accurate error signal.

Known solutions are based on the above principle, but implementation methods vary. Several types of implementation methods are as follows:

(a) A simple peak detector—passive equalizing network method, which has a fixed pole and variable zero combination in the complex impedance plane. The position of the zero in the plane is varied by varying the current passing through a diode, causing its resistance to change, and thus the impedance of the passive equalizing network. The tuning range of the equalizer is determined by the values of the components.

The main advantages of this method are that it is simple to implement, and the transfer function can be easily modeled.

The main drawbacks of the method are that the single pole-zero pair causes high jitter in the output signal from the equalizer. It has a limited tuning range. The method is not suitable for monolithic integrated circuit implementation. The telephone line model is hard wired in the components.

(b) A variable pole—variable zero method, which uses a pole-zero pair in which the positions of both the pole and the zero are variable. A peak detector generates a control voltage that drives field effect transistor (FET) gates, which form nonlinear resistance elements for both the pole and the zero circuits. The model in this case is a hyperbolic function which represents a close approximation of the telephone line transfer function.

The main advantage of this method is that it is simple to implement.

The main disadvantages of this method is its limited tuning range, and that the components of the model are hard wired.

(c) A programmable automatic gain control (AGC) circuit—peak detector combination method, in which only the amplitude of the signal is recovered. The transfer function is set by selecting one of a fixed number of possible settings.

The disadvantages of this method are its low flexibility, its limited tuning range, and that the components of the model are hard wired.

(d) A switched capacitor method, which substantially eliminates the need for a passive network to create a nonlinear transfer function.

The advantage of this method is that it can be implemented in a monolithic integrated circuit.

The main disadvantages of the method are that it is inherently low speed, and that there is need for a special clock signal for sampling, which clock speed is much higher than the data rate. In addition, the components of the model are hard wired.

(e) The capacitor array method, which is based on an array of capacitors which have sizes set in a monotonically increasing order. By turning capacitors on and off, one can change the shape of the transfer function, and therefore create an adaptive equalizer.

The main advantages of this method are that it can be implemented in a monolithic integrated circuit, and that digital control feedback is possible.

The main disadvantages of this method are that it has low flexibility, and there is a need for several operational regions due to the components having limited tuning range. In addition, the components of the model are hard wired.

A description of prior art methods may be found in U.S. Pat. Nos. 3,568,100, 5,257,286, 4,606,043, 4,745,622, 4,887,278 and 5,627,885.

SUMMARY OF THE INVENTION

The present invention eliminates substantially all of the drawbacks of the aforenoted prior art, and at the same time may be fabricated using monolithic integrated circuit technology. The present invention is easy and fast to develop for a particular application, and has a flexible and programmable nonlinear transfer curve which is programmable even by the customer of the equipment in which it resides. It also has an open loop mode which can be used to debug and tune the circuit. It is suitable for fully monolithic implementation, and for high-speed applications such as T1 and E1 type communication systems. It also requires minimal configuration by the user, e.g. a minimal number of programmable operational regions (long and short haul).

In accordance with an embodiment of the invention, a method of equalizing a signal degraded as a result of passing through a transmission medium, comprises:

(a) storing plural equalizer transfer function control values in a memory, (b) passing the signal through an equalizer having a controllable transfer function, (c) comparing a characteristic of the output signal of the equalizer with a reference signal and producing a difference signal, (d) using the difference signal to select a set of stored transfer function control values from the memory, (e) controlling the equalizer from the selected transfer function control values so as to minimize their difference from the reference signal.

In accordance with another embodiment, an adaptive equalizer apparatus comprises:

(a) an equalizer for a signal received from a transmission medium, the equalizer having control inputs for receiving control signals for controlling the transfer function of the equalizer, (b) a peak detector for detecting a peak amplitude of an output signal of the equalizer, (c) a memory for storing plural values of transmission medium characteristics for plural points along the transfer function, (d) a selection control circuit for comparing the peak with a reference and for causing selection of transmission medium characteristic values at the plural points so as to have minimum difference of the peak amplitude from the reference, and (e) an equalizer control circuit for receiving the selected transmission medium characteristic values from the memory and for applying the control signals for controlling the transfer characteristics of the equalizer, to the control inputs of the equalizer.

BRIEF DESCRIPTION OF THE DRAWINGS

A better understanding of the invention will be obtained by a consideration of the detailed description below, in conjunction with the following drawings, in which.

DETAILED DESCRIPTION OF EMBODIMENTS OF THE INVENTION

Figure 1:
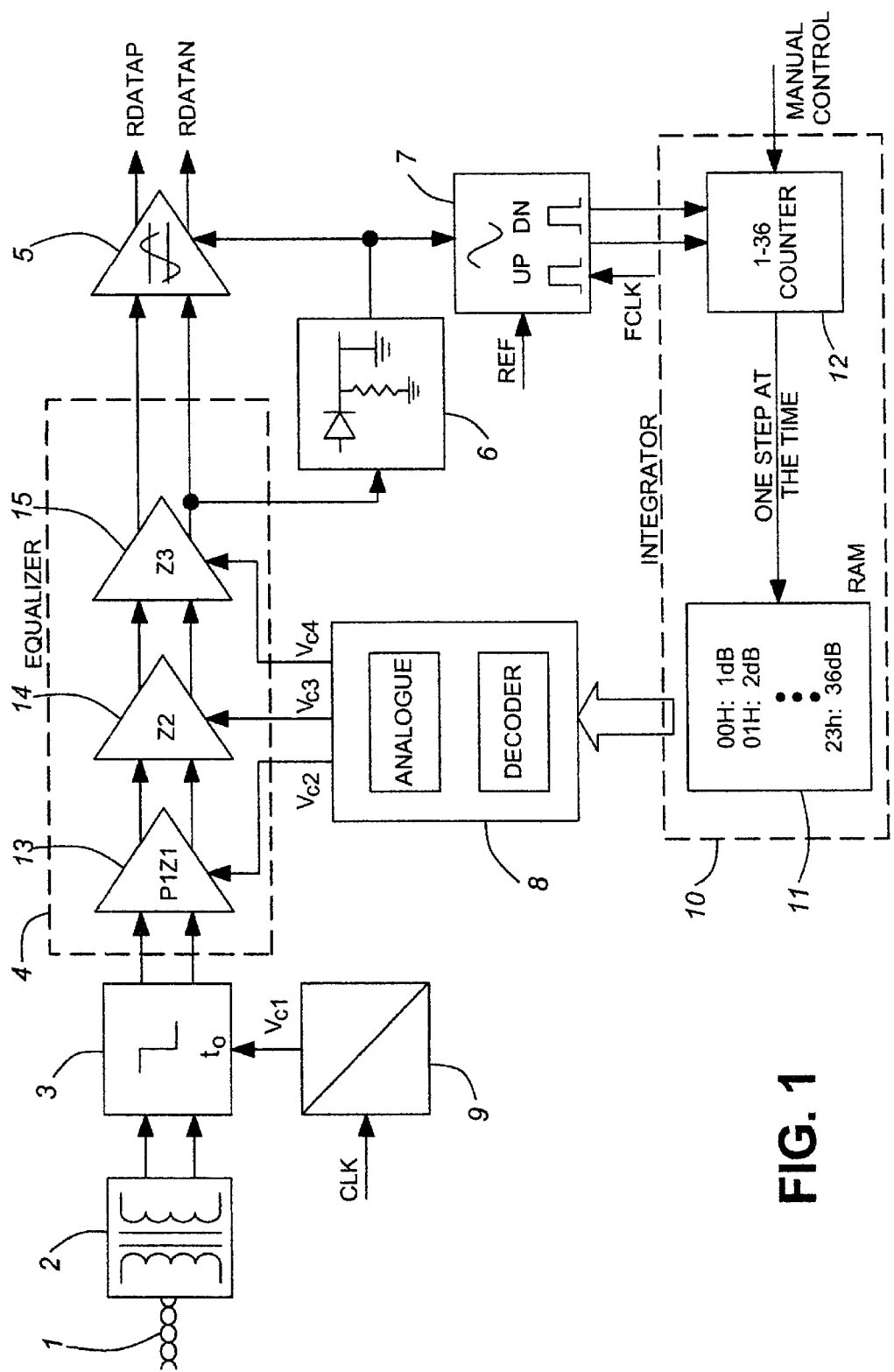
FIG. 1 is a block diagram of an embodiment of the invention.

A transmission cable 1 is coupled via a transformer 2 and a band limiting filter 3 to the input of an equalizer 4. The output of the equalizer is coupled to the input of a digital pulse generator (e.g. a slicer) 5.

An output of the equalizer is coupled to the input of a peak detector 6, the output of which is coupled to the input of a feedback control circuit 7 and to a control input of the slicer 5. The output of the feedback control circuit 7 is coupled to the input of a counter 12, the output of which is coupled to address decode inputs of a memory 11, shown as a random access memory RAM.

The output of the memory 11 is coupled to the input of an equalizer control circuit 8 which is comprised of a decoder for the read output data from memory 11 and an analog control signal generation circuit which is controlled by the decoded output data from memory 11.

The analog output signals from equalizer control circuit 8 is applied to control inputs of equalizer 4 to control its transfer function.

The equalizer 4 has a plurality of equalizer control circuits which provide some number of variable poles and zeros. For example, as shown in FIG. 1, there are pole-zero pair control circuit 13, and two additional variable zero control circuits 14 and 15 respectively, all coupled in series.

A counter 12 and a memory 11 (e.g. a random access memory RAM) are shown contained in a block referred to herein as an integrator 10.

In operation, the data stream coming from a transmission cable (telephone line) 1 is passed through isolation transformer 2 is typically very weak and distorted. As noted earlier, the amount of signal distortion and attenuation are functions of both the cable type and the cable length. Combined, this is a very nonlinear function which is required to be nullified by the transfer characteristics of the equalizer 4. Ideally, the transfer function of the equalizer is a mirror image of the cable loss characteristic, so as to produce an output signal which ideally has a waveform identical to that originally transmitted.

It is therefore desirable to have the transfer function of the equalizer 4 to match as closely as possible the transfer characteristic of a given transmission (telephone) line for various lengths. If additional pole-zero pairs were used, a better approximation of the transfer function could be obtained, but the number of controlling circuits would increase dramatically.

In the embodiment of the present invention described herein, control circuits to establish only a pole-zero-zero-zero combination are used to approximate the ideal transfer function. It will be recognized that other pole-zero combinations could alternatively be used.

In accordance with an embodiment of the present invention, the incoming data stream from isolation transformer 2 passes through a bandlimiting filter 3 which limits the frequency spectrum entering the system to only those frequencies that carry information. The filter bandwidth should be optimized for the expected data frequency. In a successful laboratory prototype, the input data was limited to selectable T1 frequencies (1.544 MHz) and E1 frequencies (2.048 MHz); the bandlimiting filter had two distinct bandwidth settings.

A bandlimiting filter control circuit 9 performs the bandwidth selection by means of a control voltage $V_{cl}$. The bandlimiting filter control circuit 9 is preferably a frequency to voltage converter. An external detector detects the clock clk signal of the incoming signal and applies it to the control circuit 9. Control circuit 9 converts its frequency to control voltage $V_{cl}$ which sets the bandwidth of the filter 3. Thus if the clock input signal clk has a frequency of 1.544 MHz, $V_{cl}$ should take the voltage value that sets the bandlimiting filter 3 to the appropriate bandwidth for a Ti signal. If the clock input signal clk has a frequency of 2.048 MHz, Vcl should take the voltage value that sets the bandlimiting filter 3 to the appropriate bandwidth for a E1 signal.

The data stream amplitude is continuously monitored at the output of the equalizer 4 by peak detector 6. The output of the peak detector 6 dynamically sets the threshold voltage for a digital pulse generator (slicer) 5 for the best output signal to noise ratio, and controls the feedback control circuit 7.

The control signal delivered by the peak detector 6 is compared with a reference voltage ref at the input of the feedback control circuit 7. There are three possible outcomes of the comparison:

(a) The control signal level is below the reference ref signal level. In that case the UP side of the output of the feedback control circuit 7 should go into logical '1' state. The DN side of the output of the feedback control circuit should go into the logical '0' state.

(b) The control signal level is above the reference ref signal level. The UP side of the output of the feedback control circuit 7 should go into the logical '0' state. The DN side of the output of the feedback control circuit 7 should go into the logical '1' state.

(c) the control signal level is equal to the reference ref signal level. The UP side of the output of the feedback control circuit 7 should go into the logical '0' state, and the DN side of the output of the feedback control circuit 7 should go into the logical '0' state.

The UP and the DN outputs are sampled at the feedback clock rate, and are used to drive the up/down counter 12. The counter is coupled to the memory 11; its counting range should cover all addresses in the memory 11.

Further, the counter 12 is preferably controlled to allow breaking of the control loop, for manual control of the counter instead of automatic feedback control from the control circuit 7.

In a successful embodiment, the memory 11 was a RAM which had 36 registers of 8 bits each. For every UP pulse at logical '1' the counter moved one step up. For every DN pulse at logical '1' the counter 12 moved one step down. It should not move in any other case. The counter 12 should saturate at it's minimum and it maximum state. Thus, an UP at logical '1' will be ignored if the counter 12 is at its maximum value, and a DN at logical '1' will be ignored if the counter 12 is at its maximum value.

The memory 11 location should be loaded with values which represent the cable transfer characteristics at preferably 36 points along the transfer curve. However, the number of registers and therefore the number of points should be chosen for convenience and could have been any other number. The memory word selected by the counter 12 is passed to the decoder inside the equalizer control circuit 8 where it is mapped to analog control voltages $V_{c2}$, $V_{c3}$ and $VC_{c4}$. The voltage levels are directly proportional to the location of the zeros or pole-zero pairs, and therefore with the transfer characteristics of the equalizer 4.

As noted above, the up/down counter 12 and the memory 11 serve the purpose of the integrator 10 for the feedback loop. The integrator pole is set by the fclk frequency.

The integrator 10 could operate in the digital domain and the remaining parts operate in the analog domain, or the integrator 10, decoder part of the equalizer control circuit, peak detector and feedback control circuit 7 can operate in the digital domain and the remaining parts operate in the analog domain.

Thus, the difference signal of the feedback control circuit has been used to select a set of stored transfer function control values from the memory, which are used to control the pole-zero characteristics of the transfer function of the equalizer. This substantially increases the flexibility of the equalizer, as compared to those in the prior art.

While the description above has referred to equalizing a signal which has been degraded by a telephone line, it will be recognized that a pulse signal degraded in shape and amplitude by any transmission medium can be equalized using the principles of the present invention. The present invention is thus not limited by the described source of the signal to be equalized.

A person understanding this invention may now conceive of alternate embodiments and enhancements using the principles described herein. All such embodiments and enhancements are considered to be within the spirit and scope of this invention as defined in the claims appended hereto.

We claim:

1. An adaptive apparatus comprising:
   (a) an equalizer for a signal received from a transmission medium, the equalizer having control inputs for receiving control signals for controlling the transfer function of the equalizer,
   (b) a peak detector for detecting a peak amplitude of an output signal of the equalizer,
   (c) a memory for storing plural values of transmission medium characteristics for plural points along said transfer function,
   (d) a selection control circuit for comparing said peak with a reference and for causing selection of transmission medium characteristic values at said plural points so as to have minimum difference of said peak amplitude from the reference, and
   (e) an equalizer control circuit for receiving the selected transmission medium characteristic values from the memory and for applying said control signals for controlling the transfer characteristics of the equalizer to the control inputs of the equalizer,
   in which the selection control circuit is comprised of an up-down counter control circuit for receiving the reference and peak signals and for providing up or down control signals in the event of the reference and peak signals differing in one polarity direction and for providing down or up control signals in the event of the reference and peak signals differing in an opposite polarity direction, a counter for receiving the up and down signals and for counting up and down in response thereto, and for providing address signals to the memory for selecting the transmission medium characteristic values stored at the addressed memory locations.

2. An equalizer as defined in claim 1 further including a manual control input for receiving a manually provided input signal for addressing the memory in substitution for an address signal provided by the counter.

3. An equalizer as defined in claim 1 further including a digital pulse generator for receiving an output signal from the equalizer and for providing a pulse signal under control of an output signal of the peak detector.

4. An equalizer as defined in claim 1 further including a feedback clock signal input for controlling timing of sampling of an up-down control signal generated by the up-down counter control circuit for generating the up and down control signals in response thereto.

5. An equalizer as defined in claim 4 further including a band limiting filter for receiving the signal from the transmission medium for substantially reducing the amplitude of frequencies outside of a band which contains desired information and for applying a resulting signal to an input of the equalizer.

6. An equalizer as defined in claim 4 in which output words from the memory contain an equal number of bits as the number of control inputs to the equalizer, and in which the up-down counter can count a number of count values before saturation which is equal to the number of register addresses in the memory.

7. An equalizer as defined in claim 6 in which the equalizer control circuit is comprised of a decoder for receiving addressed signals stored in the memory, and an analog control signal for generating the equalizer control signals in response to the decoded signals received from the memory.

8. An equalizer as defined in claim 7 further including a band limiting filter for receiving the signal from the transmission medium for substantially reducing the amplitude of frequencies outside of a band which contains desired information and for applying a resulting signal to an input of the equalizer.

9. An equalizer as defined in claim 8 further including a digital pulse generator for receiving an output signal from the equalizer and for providing a pulse signal under control of an output signal of the peak detector.

10. An equalizer as defined in claim 1 further including a manual control input for receiving a manually provided input signal for addressing the memory in substitution for an address signal provided by the counter.

* * * * *